United States Patent [19]
Yagoura et al.

[11] Patent Number: 5,412,157
[45] Date of Patent: May 2, 1995

[54] SEMICONDUCTOR DEVICE

[75] Inventors: Hideya Yagoura; Noriaki Higuchi; Haruo Shimamoto, all of Itami, Japan

[73] Assignee: Mitsubishi Denki Kabushiki Kaisha, Tokyo, Japan

[21] Appl. No.: 91,929

[22] Filed: Jul. 16, 1993

[30] Foreign Application Priority Data

Jul. 17, 1992 [JP] Japan .................. 4-190663

[51] Int. Cl.⁶ ............................................. H01L 23/02
[52] U.S. Cl. ...................................... 174/52.4; 29/883
[58] Field of Search ............... 174/52.1, 52.3, 52.4; 29/883, 884, 885; 361/388; 257/730, 735, 787, 788, 790

[56] References Cited

U.S. PATENT DOCUMENTS

| | | | |
|---|---|---|---|
| 4,801,561 | 1/1989 | Sankhagowit | 437/207 |
| 4,849,857 | 7/1989 | Butt et al. | 361/388 |
| 4,874,722 | 10/1989 | Bednarz et al. | 437/209 |
| 4,914,741 | 4/1990 | Brown et al. | 357/74 |
| 5,075,760 | 12/1991 | Nakashima et al. | 357/70 |
| 5,152,057 | 10/1992 | Murphy | 29/883 |

FOREIGN PATENT DOCUMENTS

| | | |
|---|---|---|
| 60-189940 | 9/1985 | Japan . |
| 62-226636 | 10/1987 | Japan . |
| 256958 | 2/1990 | Japan . |
| 2125629 | 5/1990 | Japan . |
| 334357 | 2/1991 | Japan . |
| 3136270 | 6/1991 | Japan . |

*Primary Examiner*—Leo P. Picard
*Assistant Examiner*—Christopher Horgan
*Attorney, Agent, or Firm*—Leydig, Voit & Mayer

[57] ABSTRACT

A semiconductor device includes a molded resin encapsulating a semiconductor chip, outer leads extending from the molded resin and having free ends, and a resin layer connecting and supporting the outer leads along the entire length of the outer leads. The resin layer may have an activating ability for soldering. A method for manufacturing a semiconductor device includes preparing a semiconductor device having a molded resin and a plurality of outer lead portions extending from the molded resin and connected to a lead frame, forming a resin film on and between the outer lead portions; cutting the lead portions to provide cantilevered outer leads having free ends; lead-forming the outer leads with lead-forming dies while heating the resin film to form a resin layer connecting and supporting the outer leads along the entire lengths of the outer leads, and taking the semiconductor device out of the lead-forming dies after the resin layer has been cured.

9 Claims, 5 Drawing Sheets

SEMICONDUCTOR DEVICE

BACKGROUND OF THE INVENTION

This invention relates to a semiconductor device and, more particularly, to a semiconductor device having outer leads which extend in a canti-levered manner from a mold-resin and a manufacturing method therefor.

FIG. 8 is a sectional view illustrating a conventional process of lead-forming outer leads of a semiconductor device and FIG. 9 is a perspective view of a conventional semiconductor device after the lead-forming. In FIGS. 8 and 9, a conventional semiconductor device 1 comprises a mold resin 1a and a number of outer leads 2 which are curved by lead-forming and which extend in a canti-levered manner from the mold resin 1a and have free ends 2a. To manufacture this semiconductor device 1, a semiconductor device which is encapsulated in a resin 1a and which is separated from the lead frame (not shown) is prepared. As generally known, the semiconductor device 1 in this state has a number of outer leads 2 which extend in a straight canti-levered manner from the mold resin 1a. As illustrated in FIG. 8, when this semiconductor device 1 is clamped between an upper die 3a and a lower die 3b of lead-forming dies 3, the upper die 3a and the lower die 3b act only on the outer leads 2 to bend and form them according to the shape of the lead-forming dies 3 as illustrated in FIG. 8. After the lead-forming, the semiconductor device 1 with the formed outer leads 2 is taken out from the lead-forming dies 3.

During storage, carrying, and handling of the semiconductor device 1, various external forces are exerted to the outer leads 2 and the outer leads 2 are often undesirably bent. In particular, recent semiconductor devices of a multiple-lead type or a thin type have a number of outer leads which are very narrow and thin. For example, copper leads in a semiconductor device manufactured by the TAB (Tape Automated Bonding) technique may have a thickness of about 35 μm. In these semiconductor devices, deformations of the outer leads 2 occur very easily, and as a result, the free ends 2a of the outer leads 2 are moved up and down from each original position 6 as illustrated in FIG. 9. Further the free end 2a of the outer lead 2 is sometimes shifted horizontally or it may be shifted both horizontally and vertically.

If there are defomations of the outer leads 2, the semiconductor device 1 cannot properly be mounted and soldered on a circuit board (not shown). That is, the free end 2a of the outer lead 2 of the semiconductor device 1 cannot be exactly set on a land (or a terminal) (See FIG. 7) of the circuit board, it moves often off of the land horizontally or it rises from the land undesirably.

Solder is usually provided by printing a solder cream through an opening of a mask (not shown) in which only the land is exposed. However, in the semiconductor device 1 where the width of the outer lead 2 or the pitch of the outer leads 2 is small, the above method cannot be applied because, if the width of the outer lead 2 is very small, the opening of the mask is also very small and the solder cream cannot be adequately supplied through the opening. Therefore, in the semiconductor device 1, solder is provided by solder plating. In this solder plating method, a soldering activator such as soldering flux is printed to the solder plating surface to remove an oxide film and improve the solderability which is reduced by for example, oxidation.

SUMMARY OF THE INVENTION

Accordingly, one object of the present invention is to provide a semiconductor device free from the above-discussed problems of the conventional semiconductor device.

Another object of the present invention is to provide a semiconductor device in which there are no deformations of the outer leads, and which can be easily and precisely soldered on the circuit board even when the number of the leads is large and the lead-pitch is small.

A further object of the present invention is to provide a semiconductor device in which soldering flux does not need to be applied on the solder plating surface.

Another object of the present invention is to provide a manufacturing method for a semiconductor device which is free from the above discussed problems of the conventional method.

With the above objects in view, the semiconductor device of the present invention comprises a mold resin sealing a semiconductor chip therein, a plurality of outer leads each extending from the mold resin and having a free end and a resin layer connecting and supporting the outer leads along the entire length of said outer leads.

The resin layer may have an activating ability for soldering.

The present invention also resides in a method for manufacturing a semiconductor device, comprising the steps of preparing a semiconductor device having a mold resin and a plurality of outer lead portions extending outside the mold resin and connected to a lead frame, forming a resin film on and between the outer lead portions, cutting the lead portions to provide canti-levered outer leads having free ends, lead-forming the outer leads with lead-forming dies while heating the resin film to form a resin layer connecting and supporting the outer leads along the entire lengths of the outer leads and taking out the semiconductor device from the lead-forming dies after the resin layer has been cured.

Also, the present invention resides in a method for manufacturing a semiconductor device, comprising the steps of preparing a semiconductor device having a mold resin and a plurality of outer leads extending outwardly from the mold resin in a canti-levered manner to have free ends, the outer leads being lead-formed, lead-forming said outer leads with lead-forming dies, filling a resin between the outer leads through the lead-forming dies while heating the lead-forming dies to form a resin layer between the outer leads and connecting and supporting said outer leads entirely along the entire lengths of said outer leads and taking out the semiconductor device from the lead-forming dies after the resin layer has been cured.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
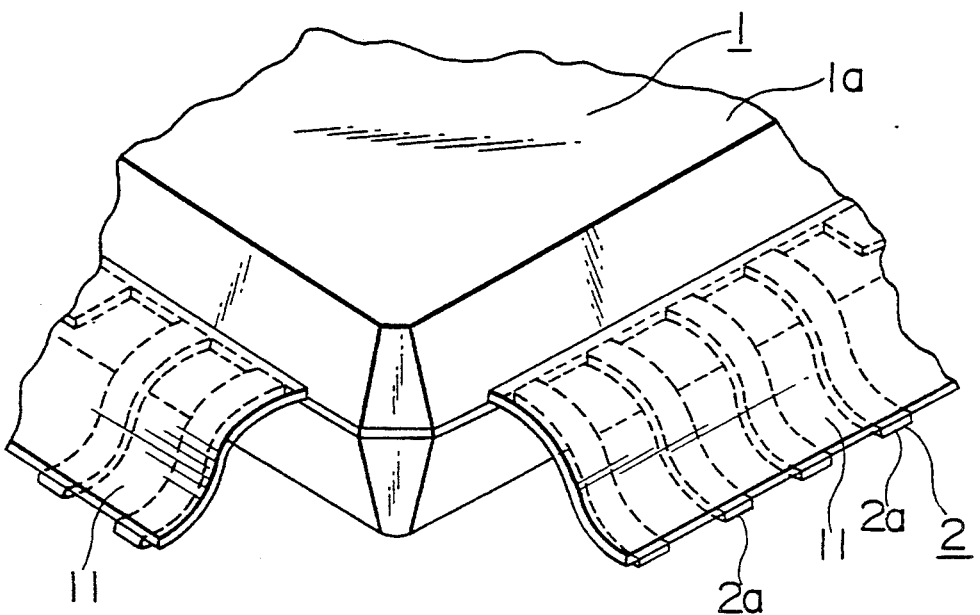
FIG. 1 is a fragmentary perspective view of an embodiment of the semiconductor device of the present invention.

FIG. 1 is a fragmentary perspective view of a semiconductor device 1 of the present invention, which comprises a substantially rectangular package or mold resin 1a sealing a semiconductor chip (not shown) therein, as is generally known. A number of outer leads 2 having free ends 2a extend outwardly in parallel canti-levered manner from each side wall of the mold resin 1a. The outer leads 2 are bent in a crank shape so that they can be soldered at the free ends 2a to lands or terminals (not shown) of a circuit board. The semiconductor device 1 of the present invention comprises a resin layer 11 connecting and supporting the outer leads 2 along the entire length of the outer leads 2. In the illustrated embodiment, the resin layer 11 is a layer of a thermoplastic resin or a thermosetting resin which completely covers upper surfaces of the outer leads 2 and extends between the outer leads 2. The suitable material is a resin which can be deformed at a comparatively low temperature as compared with the mold resin 1a such as PET (polyethylene terephthalate) resin or an epoxy resin having a comparatively low deforming temperature.

Figure 2:
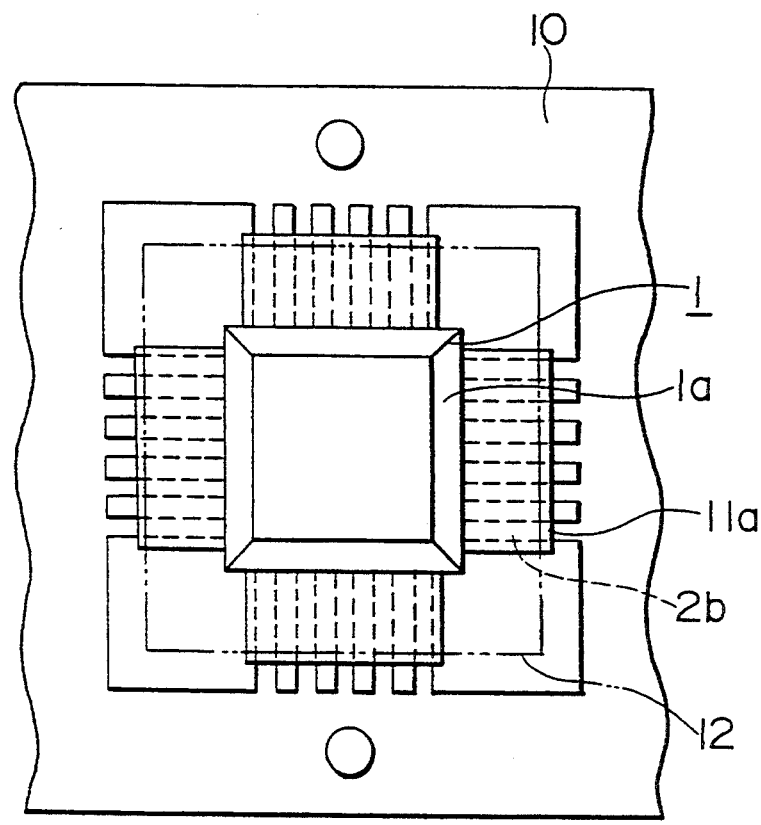
FIG. 2 is a top plan view of a semiconductor device connected to a lead frame.
Figure 3:
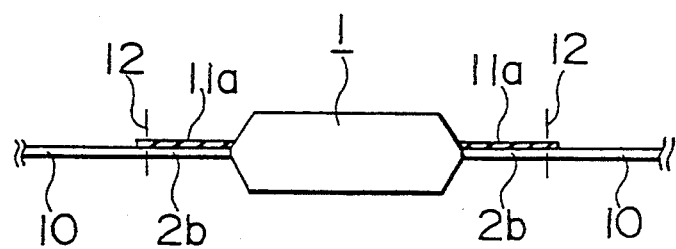
FIG. 3 is a longitudinal sectional view of a semiconductor device illustrated in FIG. 2.

The following description deals with a manufacturing method of the semiconductor device 1 of the present invention. As illustrated in FIGS. 2 and 3, the semiconductor device 1 has outer lead portions 2b which extend in parallel outwardly from side walls of the mold resin 1a and which are connected to the outer frame 10. A resin film 11a made, for example, of an epoxy resin is formed only on the lead portions 2b to cover the upper surfaces of the lead portions 2b and to extend between the leads of the lead portions 2b to connect them, the resin film 11a extends beyond the line 12 along which the lead portions 2b are to be cut. Then, in order to separate the semiconductor 1 from the outer frame 10, the lead portions 2b together with the resin film 11a are cut along the cut line 12 so that the lead portions 2b become the outer leads 2 extending in a canti-levered manner from the mold resin 1a of the semiconductor device 1 to have the free ends 2a.

Figure 4:
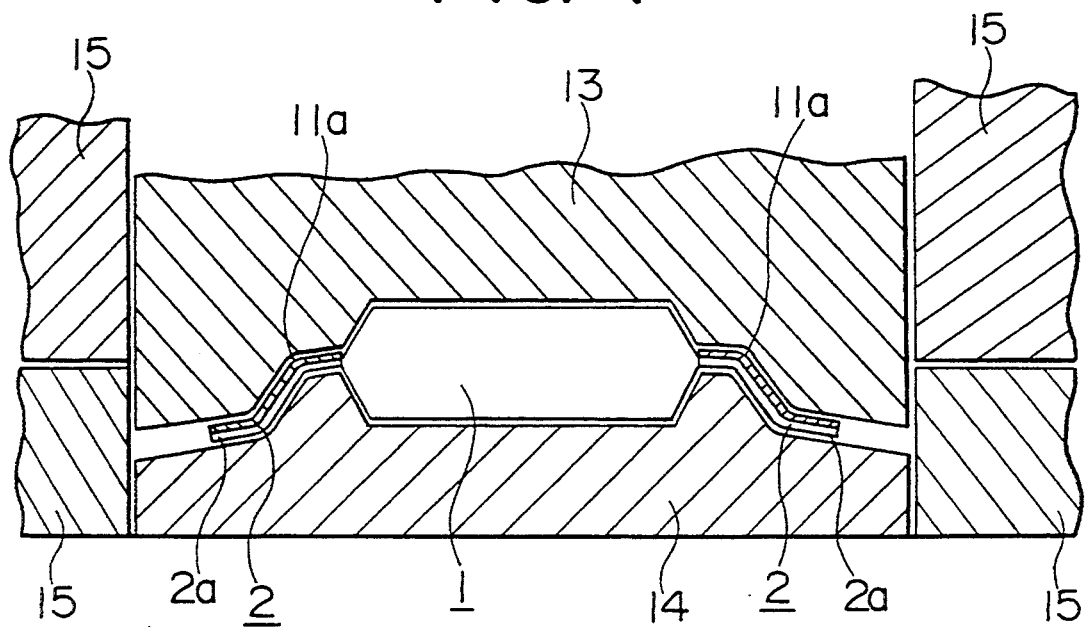
FIG. 4 is a longitudinal sectional view showing a method for lead-forming outer leads with the lead-forming dies.

Then, as illustrated in FIG. 4, in the lead forming operation, the outer leads 2 with the resin film 11a are clamped and formed by metal dies which are composed of an upper die 13, a lower die 14 and peripheral dies 15. When the resin film 11a is made of a thermoplastic resin, either the upper die 13 or the lower die 14 has a heating means (not shown) such as a heater, and when the resin film 11a is made of a thermosetting resin, then a cooling means (not shown) such as a cooling pipe for cooled water, is disposed therein in addition to the heating means. By utilizing the heat-deforming and heat-hardening properties of the resin film 11a, the resin film 11a is heated and clamped together with the outer leads 2 by the upper die 13 and the lower die 14 of the lead-forming dies, the resin film 11a being formed and hardened at the time of the lead-forming of the outer leads 2, whereby a resin layer 11 which connects and supports the lead-formed outer leads 2 along their entire length is formed. The semiconductor device 1 is removed from the lead-forming dies after the hardening, the semiconductor device 1 in this state being illustrated in FIG. 1.

Referring to FIG. 1, in the semiconductor device 1 as described above, the resin layer 11 connects and supports the outer leads 2 along the entire lengths of the outer leads 2. When the semiconductor device 1 is to be soldered to the circuit board, the outer leads 2 are restrained by the resin layer 11, and the free ends 2a of the outer leads 2 never move out of place horizontally and never rise from the lands of the circuit board. Therefore the semiconductor device 1 can be mounted and soldered on the circuit board suitably even when the pitch of the outer leads 2 is small or even when there are a great many outer leads 2.

Figure 5:
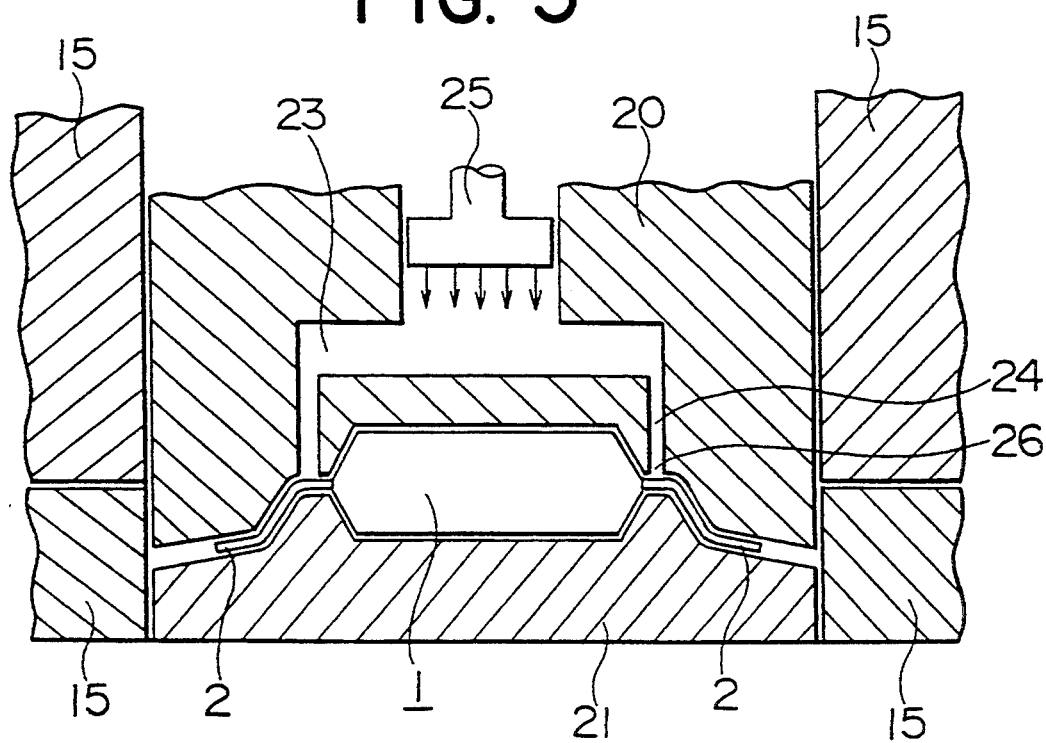
FIG. 5 is a sectional side view of another method for lead-forming outer leads with the lead-forming dies.

In the embodiment illustrated in FIG. 5, the resin is supplied after the outer leads 2 are formed. In FIG. 5, a resin chamber 23 is disposed in an upper die 20. After the outer leads 2 which are overhanging and have free ends are formed by the upper and lower dies 20 and 21 a thermoplastic resin such as a PET resin and a polypropylene resin is injected by a piston 25 into spaces between the outer leads 2 through a resin filling passage 24 and resin inlet hole 26, which are connected to the resin chamber 23, while the upper and lower dies 20 and 21 are heated. The injected resin is cooled and hardened to make a resin layer 22 illustrated in FIG. 6, which connects and supports the outer leads 2 along the entire length of the outer leads 2.

Figure 6:
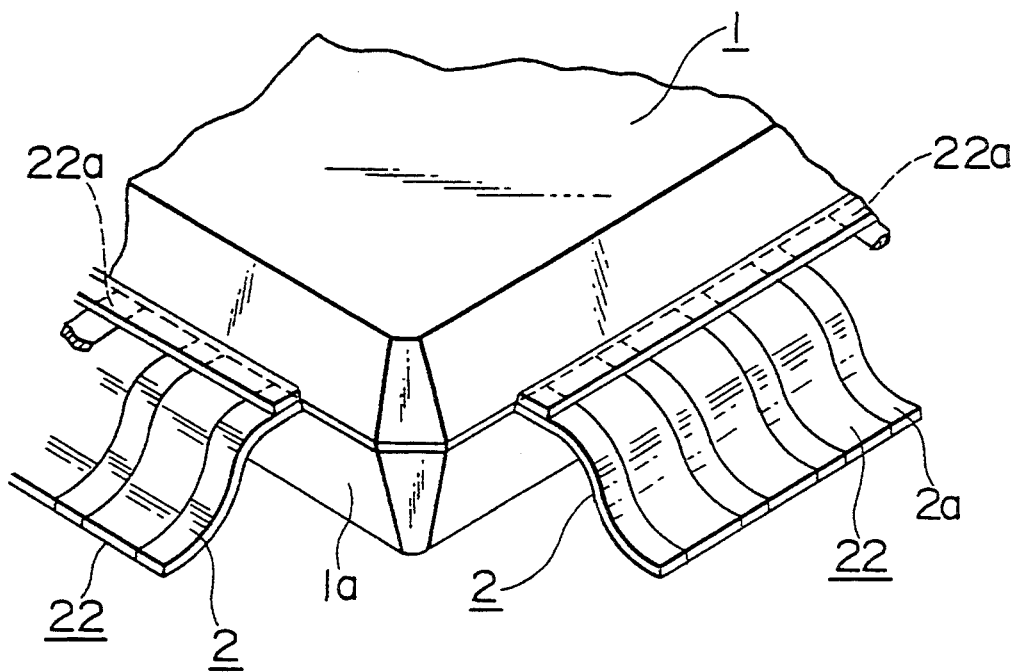
FIG. 6 is a fragmentary perspective view of another embodiment of the semiconductor device of the present invention.

FIG. 6 illustrates the semiconductor device 1 which is taken out from the upper and lower dies 20 and 21 after the resin layer 22 has been hardened. The open end of the resin inlet hole 26 is widened to supply a resin between all the outer leads 2 uniformly, and a portion of the resin layer 22 which faces the resin inlet hole 26 becomes a riser wall 22a extending upwardly. The riser wall 22a also supports the outer leads 2. Further, the resin filling passages 24 and the resin inlet holes 26 are disposed on each side wall of the mold resin 1a to uniformly inject the resin. As mentioned above briefly, the open end of the resin inlet hole 26 is a long and narrow rectangle which is extended across all the outer leads 2, and is perpendicular to each outer lead 2 flowing and pouring the resin therefrom. The resin chamber 23 may be disposed in the lower die 21. In this embodiment, since the resin layer 22 is disposed only between the free ends 2a of the outer leads 2, the semiconductor device 1 can be soldered at both surfaces of the free end 2a, this embodiment can be applied to a semiconductor device 1 in which the outer leads 2 are lead-formed in opposite direction.

Figure 7:
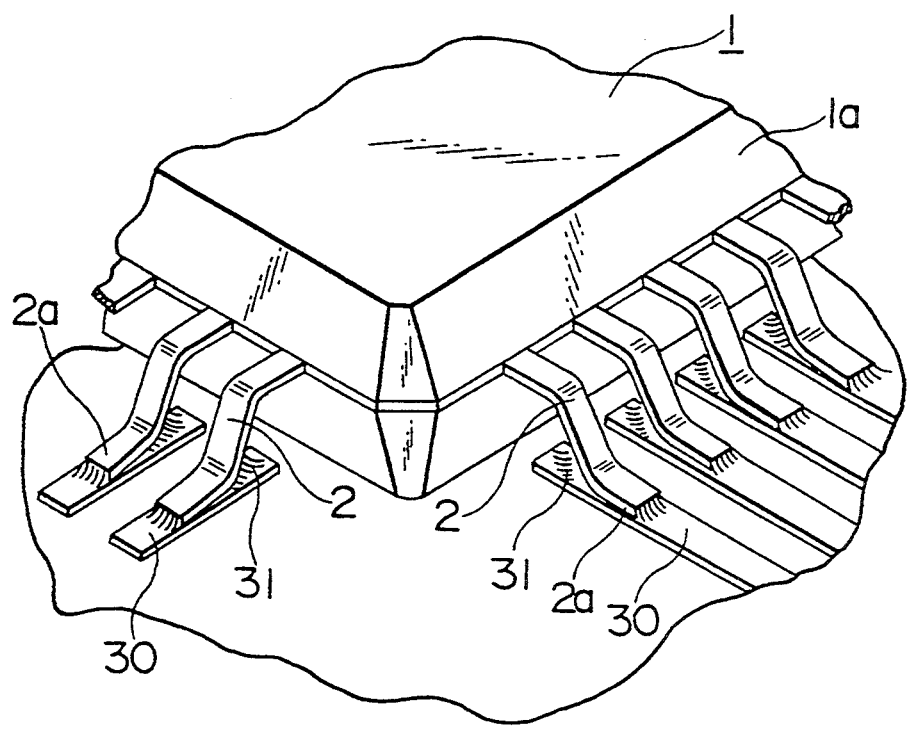
FIG. 7 is a fragmentary perspective view of still another embodiment of the semiconductor device of the present invention.
Figure 8:
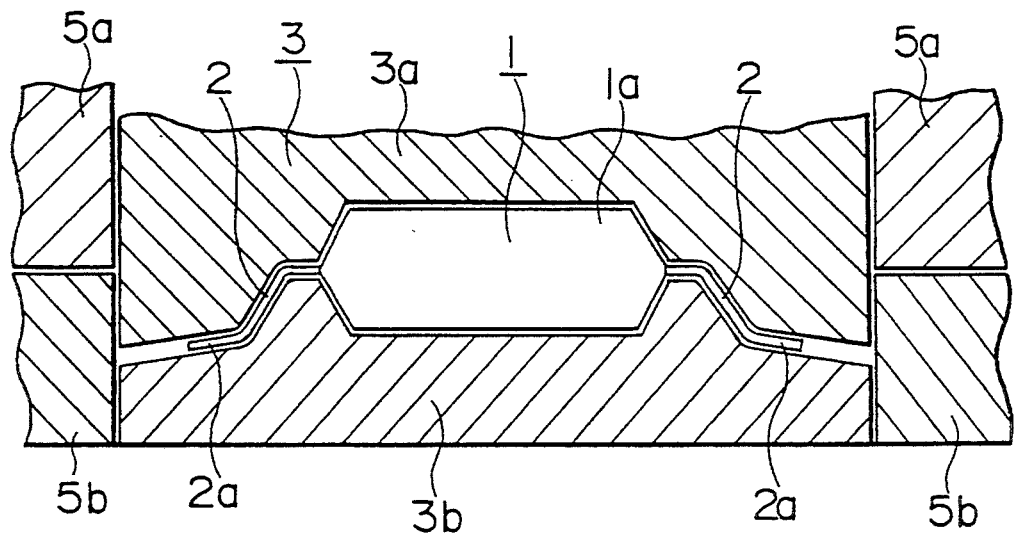
FIG. 8 is a sectional side view of a semiconductor device manufactured by a conventional method for lead-forming outer leads with lead-forming dies.
Figure 9:
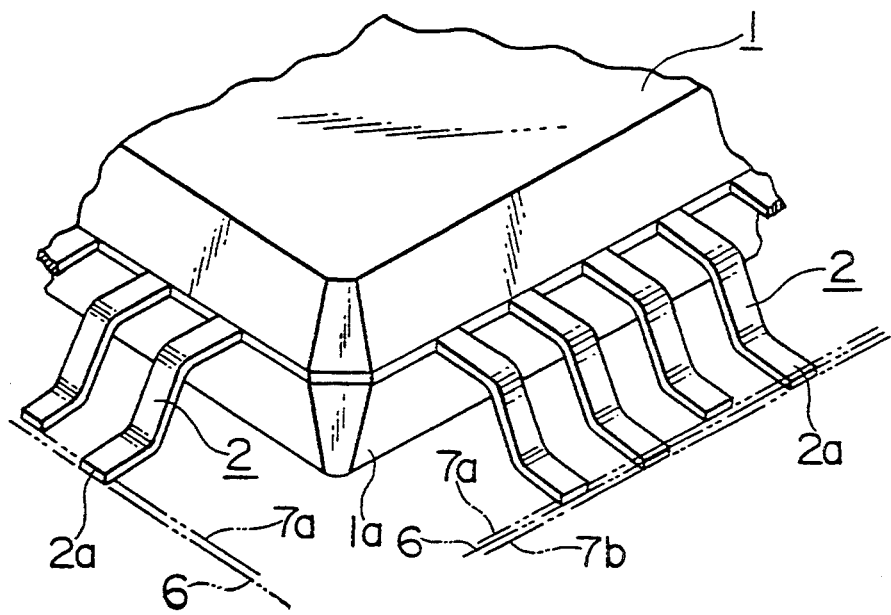
FIG. 9 is a fragmentary perspective view of a conventional semiconductor device.

FIG. 7 illustrates another embodiment of the semiconductor device 1 of the present invention, in which the resin layers 11 (in FIG. 1) and 22 (in FIG. 6) are made of a resin which can be melted by soldering heat for activating and improving solderability or, alternatively, the resin layers 11 and 22 are made of a resin which can be melted by the soldering heat and include a soldering activator. Because the resin having an activating ability for soldering is used as the resin layer 11 and 22, the solder is activated and the soldering flux is not needed to be printed separately. The semiconductor device 1 can be soldered and mounted on the circuit board easily and securely. As illustrated in FIG. 7, the resin layer 11 or 22 is melted by the soldering heat and the outer leads 2 is soldered with the solder to a land or a terminal 30 of the circuit board while being activated by the melted activating resin layer 11 or 22. Reference numeral 31 designates a fillet or curved portion of the solder. A thermoplastic resin such as a synthetic rosin is used for the resin layer 11 or 22 having an activating ability. For the solder activator which is mixed in the resin, polypropylene resin, rosin powder, or microcapsules which are melted by the soldering heat and include an activating material such as hydrochloric acid, are used. When the soldering operation is finished, the resin layer 11 or 22 is melted and disappears completely.

In the case of the semiconductor device in which the pitch of the outer leads 2 is small, solder is applied by plating solder because solder cannot be applied by the printing method in which solder cream is printed. In a conventional semiconductor device, a soldering activator such as soldering flux must be printed on the solder plating surface to improve the solderability thereof. However, in the semiconductor device of the present invention, since the resin layer has solder activating ability, a soldering activator is not needed and the semiconductor device can be mounted on a circuit board easily.

What is claimed is:

1. A semiconductor device comprising:
   a semiconductor chip;
   a molded body of a first resin encapsulating said semiconductor chip;
   a plurality of outer leads extending from said molded body, each outer lead having a first end adjacent said molded body, a free end remote from said molded body, and a length from said molded body to said free end wherein said molded body includes a riser wall transverse to and on one side of said plurality of outer leads, adjacent the first ends of said plurality of outer leads, and projecting toward the free ends of said plurality of outer leads; and
   a layer of a second resin, different from the first resin, transverse to, connecting, and supporting said outer leads along their lengths.

2. A method for manufacturing a semiconductor device comprising the steps of sequentially:
   preparing a semiconductor device having a molded body of a first resin and a plurality of outer lead portions extending from said molded body of a first resin and connected to a lead frame;
   forming a film of a second resin, different from the first resin, on and between said outer lead portions adjacent said molded body;
   cutting said outer lead portions to provide cantilevered outer leads having free ends;
   lead-forming said outer leads with lead-forming dies while heating said film of a second resin to cure said second resin; and
   taking the semiconductor device out of said lead-forming dies after said film of a second resin has been cured.

3. A method for manufacturing a semiconductor device comprising the steps of sequentially:
   preparing a semiconductor device having a molded body of a first resin and a plurality of outer leads extending outwardly from said molded body of a first resin in a cantilevered manner with free ends;
   lead-forming said outer leads with lead-forming dies;
   placing a second resin, different from the first resin, between said outer leads in said lead-forming dies while heating said lead-forming dies to form and cure a layer of the second resin between said outer leads along the lengths of said outer leads; and
   taking the semiconductor device out of said lead-forming dies after said layer of the second resin has been cured.

4. The semiconductor device as claimed in claim 1 wherein said second resin is a rigid resin selected from the group consisting of polyethylene terephthalate, epoxy, and polypropylene resins.

5. A semiconductor device comprising:
   a semiconductor chip;
   a molded body of a first resin encapsulating said semiconductor chip;
   a plurality of outer leads extending from said molded body, each outer lead having a first end adjacent said molded body and a free end remote from said molded body and a length from said molded body to said free end; and
   a layer of a second resin, different from the first resin, transverse to, connecting, and supporting said outer leads along their lengths wherein said second resin layer comprises an activating agent for aiding soldering of the free ends of said plurality of outer leads to corresponding terminals.

6. The semiconductor device as claimed in claim 5 wherein said second resin comprises rosin.

7. The semiconductor device as claimed in claim 5 wherein said layer of a second resin comprises an activating agent selected from the group consisting of polypropylene resin, rosin powder, and microcapsules of hydrochloric acid.

8. A semiconductor device comprising:
   a semiconductor chip;
   a molded body of a first resin encapsulating said semiconductor chip;
   a plurality of outer leads extending from said molded body, each outer lead having a first end adjacent said molded body, a free end remote from said molded body, a length from said molded body to said free end, opposed top and bottom surfaces, and opposed side surfaces, said molded body including a riser wall transverse to and on one side of said plurality of outer leads, adjacent the first ends of said plurality of outer leads, and projecting toward the free ends of said plurality of outer leads; and
   a layer of a second resin, different from the first resin, disposed between and contacting the side surfaces of said plurality of outer leads along their lengths, thereby connecting and supporting said outer leads.

9. The semiconductor device as claimed in claim 8 wherein said second resin is a rigid resin selected from the group consisting of polyethylene terephthalate, epoxy, and polypropylene resins.

* * * * *